United States Patent
Backhau

(10) Patent No.: US 7,097,915 B2
(45) Date of Patent: Aug. 29, 2006

(54) SEPARATOR PLATE FOR MANUFACTURING PRINTED CIRCUIT BOARD COMPONENTS

(75) Inventor: Ernst D Backhau, Sexau (DE)

(73) Assignee: C2C Technologie fur Leiterplatten GmbH, Leoben-Hinterberg (AT)

( * ) Notice: Subject to any disclaimer, the term of this patent is extended or adjusted under 35 U.S.C. 154(b) by 129 days.

(21) Appl. No.: 10/627,042

(22) Filed: Jul. 25, 2003

(65) Prior Publication Data

US 2004/0151941 A1    Aug. 5, 2004

(30) Foreign Application Priority Data

Dec. 27, 2002  (AT) .............................. A 1937/2002

(51) Int. Cl.
   *H05K 3/00*   (2006.01)
   *B32B 15/20*  (2006.01)

(52) U.S. Cl. ...................... 428/615; 428/652; 428/653; 428/675; 428/677; 428/686; 428/209; 428/901

(58) Field of Classification Search ................ 428/615, 428/624, 626, 653, 652, 675, 677
   See application file for complete search history.

(56) References Cited

U.S. PATENT DOCUMENTS

| | | | | |
|---|---|---|---|---|
| 3,462,827 A | * | 8/1969 | Winter | ...................... 228/172 |
| 3,861,884 A | * | 1/1975 | Popplewell et al. | ........ 428/652 |
| 3,952,938 A | * | 4/1976 | Ulam | .......................... 228/190 |
| 4,103,076 A | * | 7/1978 | Ulam | .......................... 428/653 |
| 4,167,606 A | * | 9/1979 | Ulam | .......................... 428/653 |
| 4,759,486 A | * | 7/1988 | Malone et al. | .............. 228/148 |
| 5,153,050 A | | 10/1992 | Johnston | |
| 5,256,474 A | | 10/1993 | Johnston | |
| 6,060,438 A | * | 5/2000 | Oleksiak | ..................... 508/485 |

FOREIGN PATENT DOCUMENTS

| JP | 63-172639 | * 7/1988 |
| JP | 04-319431 | * 11/1992 |
| WO | 99/53737 | 10/1999 |
| WO | 02/058448 | 7/2002 |

* cited by examiner

*Primary Examiner*—John J. Zimmerman
(74) *Attorney, Agent, or Firm*—Ladas and Parry LLP

(57) ABSTRACT

A separator plate for the production of printed circuit board components by pressing individual layers, which separator plate includes a metallic core layer and a coating on at least one side of the core layer, wherein the coating on the core layer, which is made of a comparatively well heat-conductive metal, is comprised of an outer metal layer applied to the core layer by cold-plating and made of a metal having a comparatively high surface hardness.

13 Claims, 3 Drawing Sheets

SEPARATOR PLATE FOR MANUFACTURING PRINTED CIRCUIT BOARD COMPONENTS

The invention relates to a separator plate for manufacturing printed circuit board components by pressing individual layers, which separator plate includes a metallic core layer and a coating on at least one side of the core layer.

To produce printed circuit board components comprised of several layers and, in particular, so-called multilayer printed circuit boards or, in short, multilayers, it is known to inter-connect packages of individual layers to be pressed in suitable multiplaten or vacuum presses at a temperature of, for instance, about 180° C. The individual arrangements are made up of copper foils, which are required for the production of conductive tracks, as well as of synthetic resin layers (prepreg layers, usually epoxy resin layers) or laminated layers. Manufacture comparable to that of multilayer printed circuit boards is conceivable with so-called basis materials for printed circuit boards, which usually comprise a synthetic resin layer (prepreg layer) single-clad or double-clad with a conductive layer (particularly a copper foil). These basis materials or supporting boards are also used as what is called "inner layers" in the manufacture of multilayer printed circuit boards and, per Be, likewise constitute printed circuit board components.

During pressing as indicated above, several press packages are, as a rule, arranged in a press one above the other, and these packages are separated from one another by separator plates also referred to as press plates. The separator plates primarily care for a uniform pressure and temperature distribution during the pressing of the individual layers in order to obtain high-quality printed circuit board products. The separator plates in most cases are comprised of sheet steel or even sheet aluminum and, therefore, are also called separator sheets. Bearing in mind their function described, they are to be harder than copper foils. This requirement is even more relevant when taking into account that the conductive tracks of modern printed circuit boards have become narrower and narrower and also their spacings have been considerably reduced. With so-called high-tech printed circuit boards, for instance, copper foils having thicknesses of <12 μm, e.g. not more than 5 μm, are used according to HDI (high density interconnect) technology. This involves the risk of the tracks being forced through the outer copper foils in the press packages during pressing, which effect is referred to as "image transfer". In order to avoid such an image transfer in a cost-effective manner, fine-steel plates having thicknesses of, for instance, 1.5 mm or 1.2 mm are, therefore, mostly used as separator plates in multilayer technology, since such fine-steel plates have a high surface hardness and, in addition, can be used several times, which is also desired for cost reasons.

On the other hand, fine steel exhibits a comparably poor thermal conductivity, whereas, in order to assure appropriate quality, particularly rapid and uniform heat distribution over the surface of the individual layers as well the entire height or thickness of the stack to be pressed is of particular importance, in particular, with the previously mentioned HDI printed circuit boards having increasingly reduced track widths and track spacings. Accordingly, known separator plates offering enhanced thermal conductivities particularly consist of aluminum (or an aluminum alloy; where aluminum is referred to in the following, it is meant to encompass also an aluminum alloy), cf., for instance, U.S. Pat. No. 5,153,050 A. Aluminum sheets as separator plates, however, have a substantially lower surface hardness as compared to separator plates made of fine steel, and their apparent yield point, for instance, is only 40% of the yield point of fine steel. Add to this that aluminum will lose about 25% of its strength (yield point) exactly at the pressing temperatures of about 180° C. to 200° C., being "soft-annealed". This again causes the previously mentioned image transfer. By contrast, the strength or surface hardness of separator plates made of fine steel does virtually not yet change at a pressing temperature of 180° C. or 200° C.

A further disadvantage of aluminum separator plates is to be seen in that aluminum has a high thermal expansion coefficient as compared to most of the other materials contemplated in this respect. As already pointed out before, this will cause a displacement of the individual layers to be pressed within the press package as the aluminum separator plates expand during pressing, particularly after the liquefaction of the epoxy resin, and this may result in defects, and hence rejects, especially at the micrometer track widths mentioned and, in particular, already at widths of, for instance, 100 μm and less.

The disadvantages initially mentioned in the context of aluminum separator plates in a comparable manner apply to separator plates made of copper. Copper would be an excellent heat conductor, thus ensuring the rapid and uniform heat distribution within the stack to be pressed, yet copper fails by far to comply with the criteria required in terms of strength or surface hardness in order to avoid the image transfer mentioned.

Incidentally, a separator plate made of aluminum is known, for instance, from U.S. Pat. No. 5,256,474 A, wherein an antiadhesive layer is additionally applied to both sides of the aluminum core layer of that separator plate so as to facilitate the detachment of the separator plate from the copper layer of the printed circuit boards after pressing. Yet, this is again a sheet-aluminum separator plate having the drawbacks mentioned before.

It is, thus, an object of the present invention to provide a separator plate as defined above, by which the requirements in terms of uniform heat distribution on the one hand and high strength or surface hardness on the other hand, which actually run counter because of the material properties involved, can be met in a satisfactory manner. The invention is based on the consideration to design the separator plates as composite separator plates, thus providing and utilizing the properties of different metals in combination.

To solve this object, the invention provides a separator plate, wherein the core layer comprises a comparatively well heat-conductive metal, and the coating on that core layer comprises an outer metal layer applied to the core layer by cold-plating and made of a metal having a comparatively high surface hardness.

The separator plate according to the invention, thus, comprises a core layer or central layer made of a strongly heat-conductive metal such as aluminum or copper, and this core layer is connected at least on one side, preferably on both sides, with a hard metal such as, for instance, fine steel, carbon steel, and even nickel or the like, by cold-plating (roll-bonding). Such a hard-metal cladding can be comparatively thin, for instance, in the order of about 0.075 mm, whereas the core made, for instance, of aluminum or copper, has a thickness of 0.35 mm. Roll-bonding or cold-cladding causes the planar connection of metals in the manner of a fusion while bringing about the advantageous effect that, during heating, the thermal expansion can occur only to an extent corresponding to that of the hard-metal plating, which means that the relatively strong thermal expansions of heat-conducting metals like aluminum or copper, if used alone for the separator plate, will no longer occur. Add to this that the thermal expansion, for instance of steel, which is inherently substantially lower than that of aluminum, will take effect only at a comparatively high temperature, yet such a high temperature will not occur at the pressing of individual layers presently proposed for the production of printed circuit board components. For instance, aluminum separator plates having a size of 600×450 mm would undergo an expansion of about 5 mm in any direction, whereas a separator plate of steel having identical dimensions would experience an expansion as such of about 2 mm—yet only at high temperatures, and of only 0.1 mm to 0.2 mm, however, during pressing at the temperature in question of 180° C. or 200° C. By fusing with the hard plating material, the core layer made of a heat-conductive metal is forced to adapt to such low expansion.

A further advantage of the separator plate according to the invention resides in that low costs can be achieved despite the production as a composite plate, because aluminum has a relatively low specific weight such that the cost price to be calculated per kilogram of aluminum will hardly affect the selling price for the separator plates, which will be calculated according to the area magnitude of the separator plates.

In the main, the invention thus provides a separator plate which, on the one hand, assures uniform heat distribution over the surface and the stack height during pressing on account of the good thermal conductivity of the relevant core (based on the overall mass of the separator plate, the latter contains about 75% heat-conducting material, e.g. aluminum, and only 25% hard metal, e.g. steel), i.e., the epoxy resin liquefies at once virtually everywhere when using the separator plates according to the invention, and which, on the other hand, possesses the necessary surface hardness due to the plated hard metal in order to avoid the undesired image transfer and in order to enable frequent reuse of the separator plate in pressing procedures. For pressing, it is advantageously also feasible to apply a lubricant such as, e.g., an olefin-based lubricant on the outer layer, namely the hard metal layer.

In the following, the invention will be explained in more detail by way of a particularly advantageous exemplary embodiment, to which it is, however, not limited.

BRIEF DESCRIPTION OF THE DRAWINGS

FIG. 1 schematically depicts parts of a multilayer press package, from which it is apparent that separator plate composite components 1 alternate with individual layer arrangements 2 for multilayer printed circuit boards, in the following briefly referred to as arrangements 2. The separator plate composite components 1 represented in FIG. 1 by broken-line rectangles each comprise a separator plate 3, also called press plate or separator sheet or press sheet, to which copper foils 5 provided with resin layers 4 are applied over antiadhesive layers 6, which are comprised of separator or release foils in the present case. The whole unit comprising the resin-coated copper foil 5, 4, the separator foil 6, the separator sheet 3, another separator- or release foil 6 and another copper foil 5 coated with synthetic resin 4 is previously assembled to form a composite component 1 as will be explained in more detail by way of an exemplary embodiment illustrated in FIGS. 2 and 3.

Figure 1:
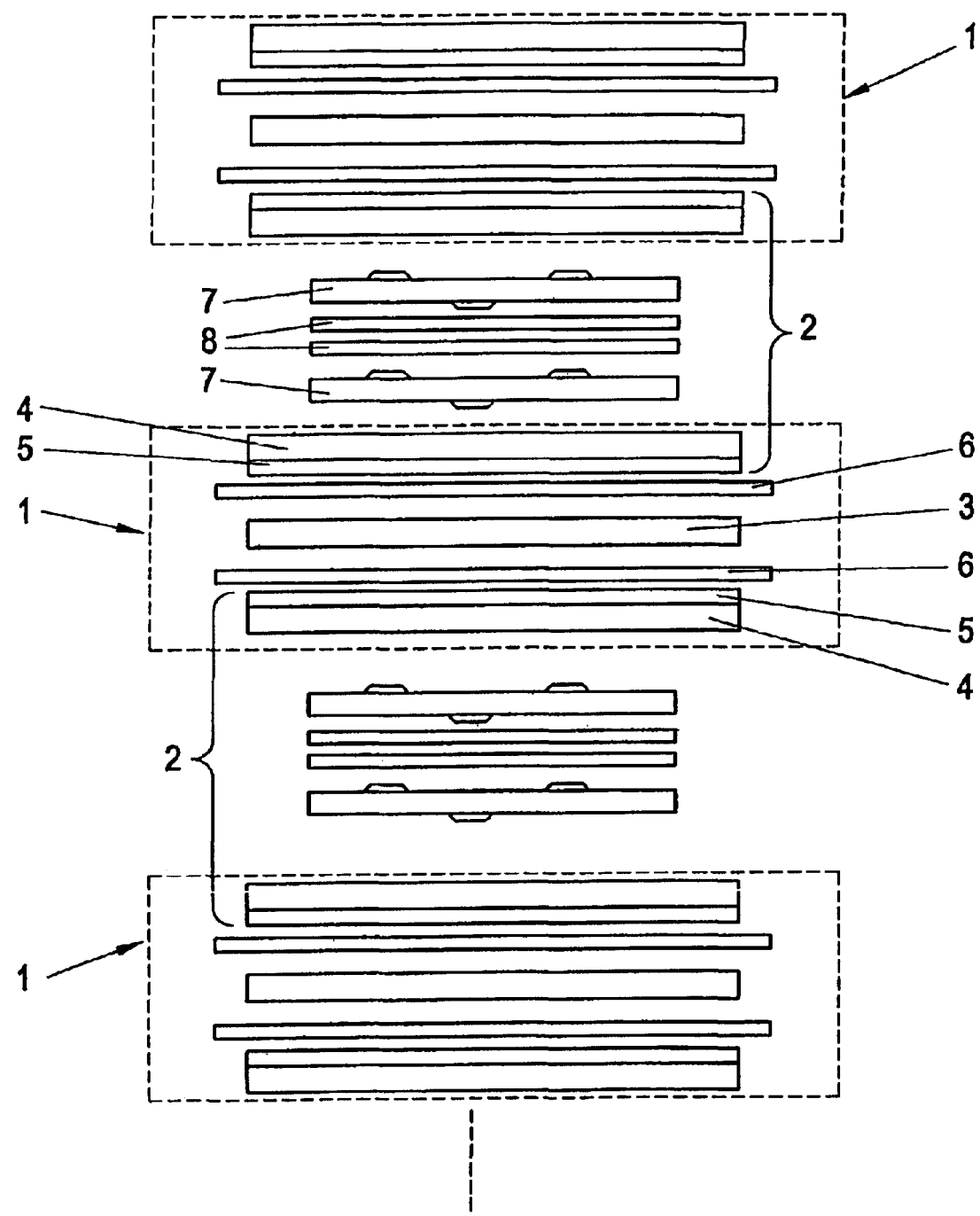
FIG. 1 is a schematic view of the structure of a multilayer press package comprising several individual layers and separator plate composite components.

The copper foils 5 coated with resin 4, of the composite components 1 form part of the multilayer printed circuit boards, to which also etched inner layers 7 (supporting boards) and epoxy resin layers (prepreg layers) 8 of the arrangements 2 belong.

Due to the fact that such separator plate composite components 1 are provided as units and in the production of the printed circuit board (components) can, in a manner alternating with the multilayer individual layers, be stacked one above the other, stacking within the press is substantially facilitated, since five components 4/5;6;3;6;5/4 can be laid at one time as a unit in a single procedure. This means a substantial reduction of the handling time. The etched inner layers 7 realize the desired circuit or printed circuit board structure, being adhered with one another by the aid of prepreg layers 8. Such bonding is effected in a press at an elevated temperature (e.g. at 180° C.) as well as under pressure or even vacuum. Such a press package, part of which is schematically illustrated in FIG. 1, may readily comprise 20 arrangements 2 stacked one above the other. The separator plate composite components 1 are laid between the individual arrangements 2, the separator plates 3 caring for a smooth, clean surface of the multilayer printed circuit boards produced.

During the defined pressing cycle, the synthetic resin of the prepreg layers 8 starts to flow. By providing the antiadhesive or release layers 6, the resin of layers 8 is prevented from reaching the separator sheets or, generally, separator plates 3, and it is also prevented that resin will flow to the edges of the separator plates 3.

Figure 2:
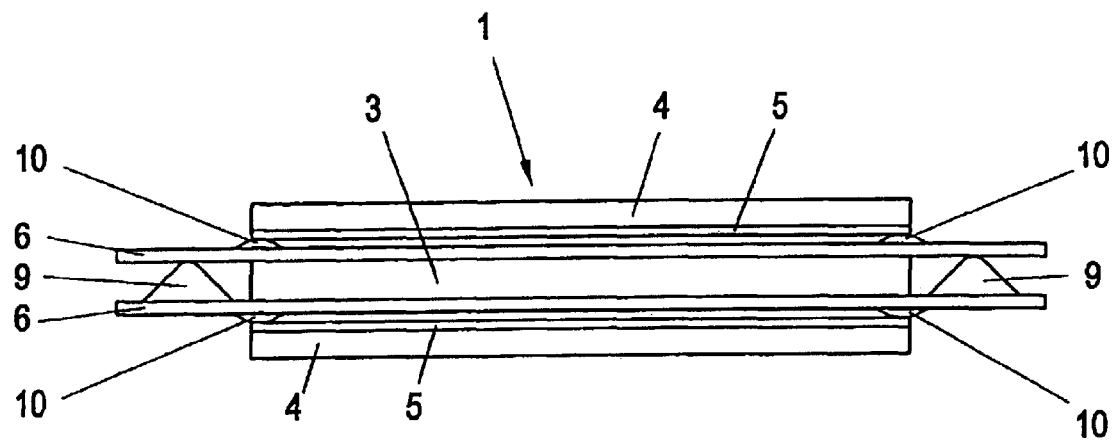
FIG. 2 is a schematic view of a separator plate composite component including a separator foil sack.
Figure 3:
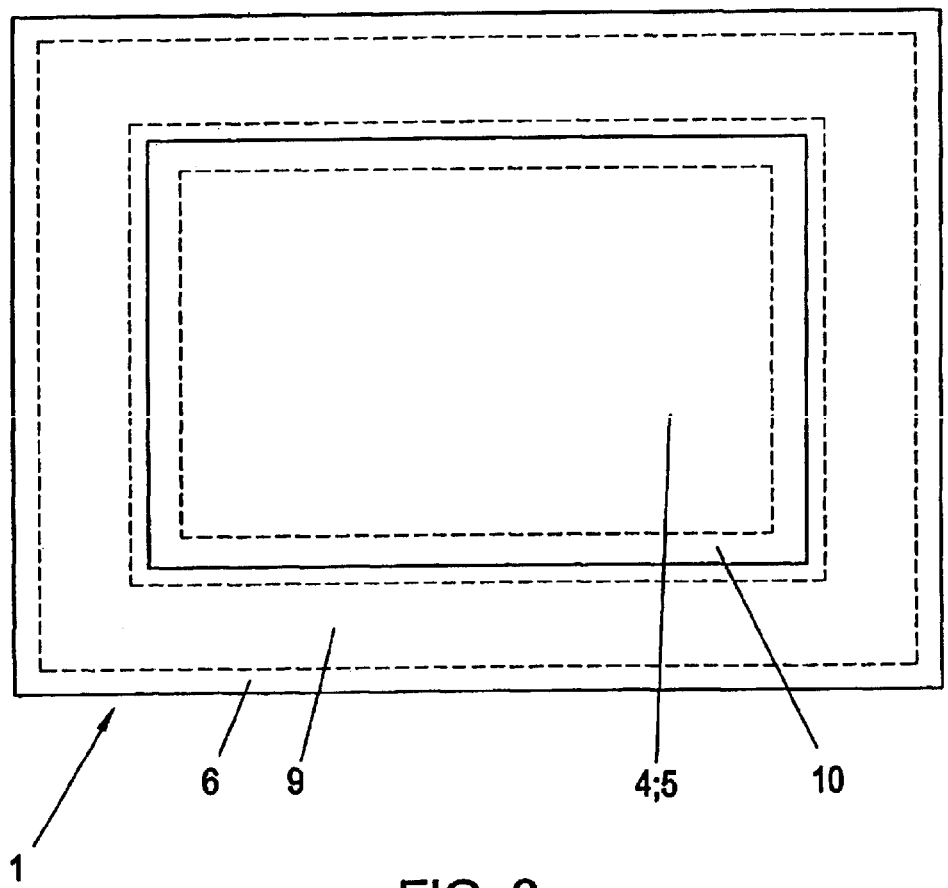
FIG. 3 is a schematic top view on such a separator plate composite component according to FIG. 2.

According to FIGS. 2 and 3, separate release foils are provided as antiadhesive layers 6, said release foils 6 being larger than the separator plate 3 and also larger than the copper foils 5 coated with the resin layers 4. As is apparent from FIG. 2, the copper foils 5 and the separator plate (press plate) 3 in this case are preferably equally large, even though the copper foils 5 may be slightly smaller than the separator plate 3. Since the release foils 6 project beyond the separator plate 3 on all sides, the liquid resin can thus be captured. In order that the resin cannot reach the separator plate 3 between the release foils 6 either, the release foils 6 are connected with each other along an adhesive seam by the aid of a pressure-sensitive adhesive, an acrylate adhesive or a melting adhesive. The separator plate 3 is, thus, enclosed between the release foils 6 interconnected in a sack-like manner, which means that the separator plate 3 is contained in a separator foil sack or bag, yet arranged in a freely movable manner within said separator foil sack.

The copper foils 5, on the other hand, are likewise glued to the release foils 6 in the manner of an adhesive seam 10 by means of adhesives, e.g. melting adhesives and, in particular, hot-melt adhesives, or acrylate adhesives.

Figure 4:
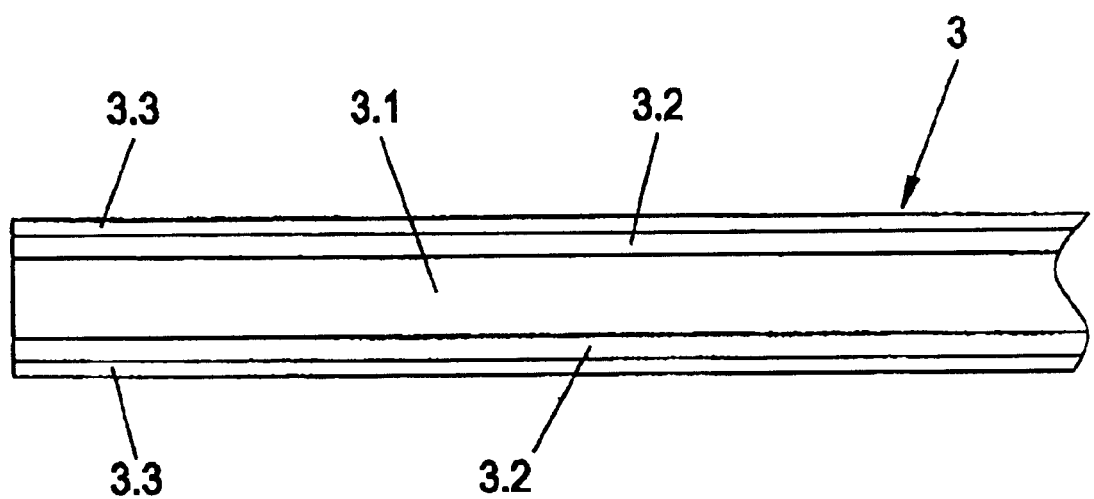
FIG. 4 is a schematic section through a separator plate embodying the present invention, which may be used in the arrangements according to FIG. 1 to 3.

FIG. 4 illustrates a schematic cross section through a separator plate 3 (without hatching for the sake of clarity) which comprises a special, novel composite structure. In detail, a central layer or core layer 3.1 made of a strongly heat-conductive metal such as, for instance, aluminum or even copper is provided, and this core layer 3.1. on both sides is outwardly bonded by roll-bonding, generally cold-plating, to an outer metal layer 3.2 made of a relatively hard metal as compared to the core layer 3.1 such as, for instance, fine steel, carbon steel, or even nickel or the like. When applying these hard outer metal layers 3.2 on the core layer 3.1 by cold-plating, the two metals are caused to fuse so as to yield a solid planar bond. In the finished separator plate 3, this solid surface bond will prevent the core layer 3.1, which is made of a comparatively well thermally conducting metal, from expanding to the extent it would when being freely present and heated, which means that an overall thermal expansion corresponding to that of the outer metal layers 3.2. made of hard metal will occur.

In an example, a separator plate 3 was provided with a core layer 3.1. of aluminum having a thickness of approximately 0.35 mm, which was covered on either side with an outer metal layer of fine steel having a thickness of about 0.075 mm. From this results a combined heat conductivity that is slightly lower than that of aluminum (or an aluminum alloy) alone, yet this combined heat conductivity is definitely in the order of the heat conductivity of aluminum, namely approximately 170 W/m·K as compared to 210 W/m·K. The combined thermal expansion of this composite separator plate 3, on the other hand, substantially corresponds to that of steel and, in particular, fine steel or even carbon steel, which means that it is, for instance, only $\frac{1}{25}$ to $\frac{1}{50}$ of the thermal expansion of aluminum alone.

From FIG. 4 it is further apparent that the composite separator plate 3 may be additionally provided with outer lubricant coatings 3.3 on both sides or surfaces, wherein said lubricant coatings may be based on olefins in a manner known per se.

Such a composite separator plate 3 comprising different metals may be used in a separator plate composite component 1 as previously described by way of FIGS. 1 to 3, yet it may as well be employed in press packages in an individual arrangement as known per se from the prior art, for instance from U.S. Pat. No. 5,336,474 A. Here and there, the present composite separator plate 3, in particular, offers the advantage of a combination of basically contradicting effects, namely a high strength and surface hardness on the one hand, as well as a good thermal conductivity on the other hand, in order to assure the rapid, uniform liquefaction of the epoxy resin and to prevent an image transfer or surface defects when pressing individual layers for the production of printed circuit boards, and to also enable the repeated use of the separator plate 3.

The invention claimed is:

1. A separator plate for the production of printed circuit board components by pressing individual layers, which separator plate comprises a metallic core layer and a metal layer on at least one side of the core layer, wherein the core layer comprises a comparatively high heat-conductive metal, the core layer having an outer surface on which said metal layer is applied by cold plating, said metal layer being made of a metal having a comparatively high surface hardness compared to the core layer and a lower heat conductivity than said core layer, said separator plate being interposed between stacks of printed circuit board layers which are subjected to compression under heat, said separator plate being a composite of said core layer and said outer metal layer to provide reduced heat expansion of the core layer during pressing of the individual layers of the circuit board components while preventing image transfer to the separator plate.

2. A separator plate according to claim 1, wherein the core layer comprises on either side a said outer metal layer applied by cold-plating having the comparatively high surface hardness.

3. A separator plate according to claim 1, wherein the outer metal layer is applied to the core layer by roll-bonding.

4. A separator plate according to claim 1, wherein the outer metal layer is made of steel.

5. A separator plate according to claim 1, wherein the outer metal layer is made of nickel.

6. A separator plate according to claim 1, wherein the core layer is made of aluminum.

7. A separator plate according to claim 1, wherein the core layer is made of copper.

8. A separator plate according to claim 1, wherein the core layer has a thickness of about 0.35 mm.

9. A separator plate according to claim 1, wherein the outer metal layer has a thickness of about 0.075 mm.

10. A separator plate according to claim 1, wherein a lubricant is applied to the outer metal layer.

11. A separator plate according to claim 10, wherein the lubricant is based on an olefin.

12. A separator plate according to claim 2, wherein the outer metal layer is applied to the core layer by roll-bonding.

13. A separator plate for the production of printed circuit board components by pressing individual layers, which separator plate comprises a metallic core layer and a metal layer on at least one side of the core layer, wherein the core layer comprises a comparatively high heat-conductive metal, the core layer having an outer surface on which said metal layer is applied by cold plating, said metal layer being made of a metal having a comparatively high surface hardness compared to the core layer and a lower heat conductivity than said core layer, said separator plate being interposed between stacks of printed circuit board layers which are subjected to compression under heat, said separator plate being a composite of said core layer and said outer metal layer to provide reduced heat expansion of the core layer during pressing of the individual layers of the circuit board components while preventing image transfer to the separator plate, said core layer having a thickness of about 0.35 mm, said outer metal layer having a thickness of about 0.075 mm, said outer metal layer having a smooth outer surface for intimate contact with the adjacent individual layers, said high surface hardness of the outer metal layer serving as a means for resisting pressure in the press and preventing disruption of the individual layers and image transfer to the separator plate, said core layer of high heat conductivity then serving as a means for providing uniform heat distribution to the adjacent individual layers.

* * * * *